United States Patent [19]

Suzuki et al.

[11] 4,455,629

[45] Jun. 19, 1984

[54] COMPLEMENTARY METAL-INSULATED SEMICONDUCTOR MEMORY DECODER

[75] Inventors: Yasuo Suzuki, Yokohama; Masanori Nagasawa, Kamakura, both of Japan

[73] Assignee: Fujitsu Limited, Kawasaki, Japan

[21] Appl. No.: 333,641

[22] Filed: Dec. 23, 1981

[30] Foreign Application Priority Data

Dec. 24, 1980 [JP] Japan ............................. 55-183074

[51] Int. Cl.$^3$ ............................................. G11C 11/40
[52] U.S. Cl. ................................... 365/230; 307/449
[58] Field of Search ................ 307/449, 463; 365/189, 365/203, 230

[56] References Cited

U.S. PATENT DOCUMENTS

| | | | |
|---|---|---|---|
| 3,825,888 | 7/1974 | Kawagoe | 307/449 |
| 3,909,808 | 9/1975 | Cochran et al. | 365/104 |
| 4,063,118 | 12/1977 | Nishimura | 307/449 |
| 4,195,238 | 3/1980 | Sato | 307/270 |
| 4,275,312 | 6/1981 | Saitou et al. | 307/449 |

FOREIGN PATENT DOCUMENTS 2205708 5/1974 France .

OTHER PUBLICATIONS

Minato et al., "2K×8 Bit Hi-CMOS Static RAM's", IEEE Journal of Solid-State Circuits, vol. SC-15, No. 4, Aug. 1980, pp. 656-660.

Primary Examiner—Joseph A. Popek
Attorney, Agent, or Firm—Staas & Halsey

[57] ABSTRACT

A complementary metal-insulated semiconductor (CMIS) which is useful for a highly integrated large-capacity ROM or RAM. The CMIS memory decoder specifies each set of $2^m$ (m is positive integer) word lines of a memory to be accessed by the CMIS memory decoder. The CMIS memory decoder includes both $2^m$ CMIS inverters per each set of the $2^m$ word lines and also $2^m-1$ pull-down transistors per each word line, the pull-down transistors being connected between ground and the corresponding word lines, the remaining $2^m-1$ word lines being connected to these pull-down transistors at their gates.

16 Claims, 14 Drawing Figures

COMPLEMENTARY METAL-INSULATED SEMICONDUCTOR MEMORY DECODER

BACKGROUND OF THE INVENTION

The present invention relates to a CMIS (complementary metal-insulated semiconductor) memory decoder, more particularly, to a CMIS memory decoder which produces an output signal for selecting a set of $2^m$ word lines.

A decoder is one of the important peripheral members for driving a ROM (read-only memory) or a RAM (random access memory). The decoder is usually fabricated by CMIS devices.

In a typical type of memory comprised of a plurality of rows and columns, decoder type units of the CMIS memory decoder are provided at every row (word line) and every column (bit line). For example, each row is accessed by an address signal through its own decoder unit.

The latest trend is, to use highly integrated large-capacity ROM's or RAM's. In such highly integrated large-capacity memories, each memory cell must be constructed extremely small in size, and, accordingly, the distance between each adjacent row must also be made extremely narrow. It becomes very difficult to properly place the decoder unit for each row because there is not enough space to accommodate each decoder unit between each adjacent row. Further, it also becomes difficult to obtain high-speed ROM's or RAM's. Thus, it is necessary to overcome the above-mentioned difficulties. One of the most useful methods for overcoming the above difficulties has already been proposed. In that method, the decoder produces an output signal for selecting each set of $2^m$ word lines, where the symbol m denotes a positive integer and m is actually defined as being 1 or 2. A selection of each set of $2^1$ word lines or a selection of $2^2$ word lines is relatively easy to apply to a RAM or CMIS memory. This is because such a RAM or CMIS memory usually needs a large space, such as 50 $\mu m \times 50$ $\mu m$, for placement of each memory cell. Accordingly, it is easy to place the CMIS decoder units between each adjacent row.

However, it is not easy for the CMIS decoder, according to the aforesaid method for selecting each set of $2^1$ or $2^2$ word lines, to be applied to a ROM, especially to a ROM constructed in the form of a so-called one-transistor-cell arrangement. In such a ROM, each memory cell can be formed in a space 7.5 $\mu m \times 8.5$ $\mu m$ in size. Accordingly, each of the decoder units comprising the CMIS decoder must also be placed in a 7.5 $\mu m \times 8.5$ $\mu m$ space. Further, in such a ROM, the CMIS decoder should be driven by the method for selecting each set of $2^2$ word lines, because said method is more effective in reducing the size of each memory cell than the method for selecting each set of $2^1$ word lines.

SUMMARY OF THE INVENTION

It is an object of the present invention to provide a CMIS memory decoder which can be used with rows being provided with very small memory cells, such as memory cells of the one-transistor-cell type ROM, especially a CMIS memory decoder which is operated under the method for selecting the set of $2^2$ word lines.

A complementary metal-insulated semiconductor which is useful for a highly integrated large-capacity ROM or RAM. The CMIS memory decoder specifies each set of $2^m$ (m is positive integer) word lines of a memory to be accessed by the CMIS memory decoder. The CMIS memory decoder includes both $2^m$ CMIS inverters per each set of the $2^m$ word lines and $2^m-1$ pull-down transistors per each word line, the pull-down transistors being connected between ground and the corresponding word lines, the remaining $2^m-1$ word lines, the remaining $2^m-1$ word lines connected to these pull-down transistors at their gates.

The present invention will be more apparent from the ensuing description with reference to the accompanying drawings.

DESCRIPTION OF THE PREFERRED EMBODIMENT

Figure 1A:
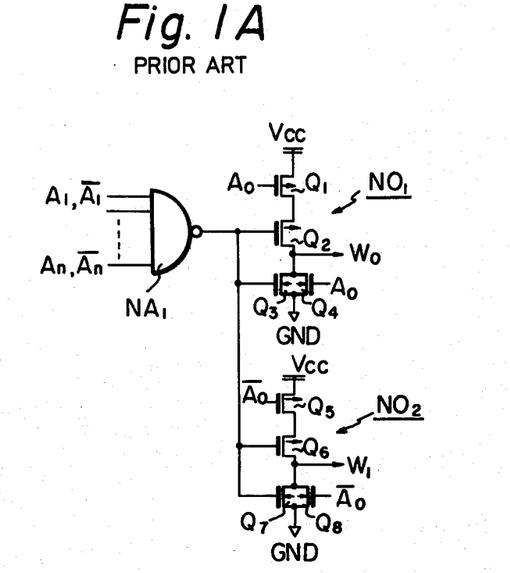
FIG. 1A is a circuit diagram of a first prior art CMIS memory decoder being operated under a method for selecting each set of $2^2$ word lines.

FIG. 1A is a circuit diagram of a first prior art CMIS memory decoder being operated under a method for selecting each set of $2^1$ word lines. The reference symbol $NA_1$ represents a NAND gate which receives either one of the address signals from each pair of addresses, that is $(A_1, \overline{A_1}), (A_2, \overline{A_2}) \ldots (A_n, \overline{A_n})$. Thus, the NAND gate $NA_1$ is opened or closed according to the address signals. When the address signals are all set to be the logic "H" (high) level, then the gate $NA_1$ produces, at its output, the logic "L" (low) level signal.

Figure 1B:
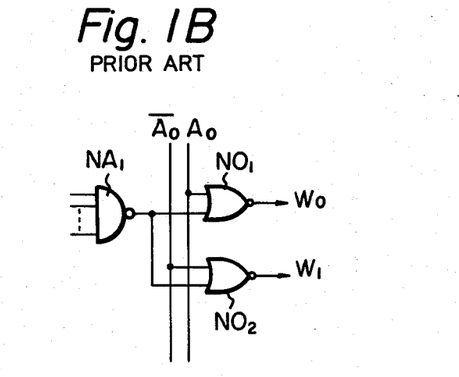
FIG. 1B is an equivalent gate diagram representing the circuit of FIG. 1A.

The reference symbols $NO_1$ and $NO_2$ represent NOR gates. The NOR gate $NO_1$ is comprised of P-channel MIS (metal-insulator semiconductor) transistors $Q_1$ and $Q_2$ and N-channel MIS transistors $Q_3$ and $Q_4$. Similarly, the NOR gate $NO_2$ is comprised of P-channel MIS transistor $Q_5$ and $Q_6$ and N-channel MIS transistors $Q_7$ and $Q_8$. When the NAND gate $NA_1$ produces the output signal of the logic "L" level, the transistors $Q_2$ and $Q_6$ are turned to ON, while the transistors $Q_3$ and $Q_7$ are turned to OFF. In this case, the word line $W_0$ or $W_1$ is selected is determined in accordance with the level of one address signal corresponding to the least significant bit, that is ($A_0$ and $\overline{A_0}$). As previously mentioned, since the decoder of FIG. 1A is operated under the selection mode defined as being m=1, the address signal of the least significant bit is necessary. If the decoder is operated under the mode being m=2, address signals of the least two significant bits ($A_0$ and $\overline{A_0}$) and $A_1$ and $\overline{A_1}$) are necessary. With reference to FIG. 1A, when the least significant bit $A_0$ is the logic "L" level, the transistors $Q_1$ and $Q_8$ are turned to ON and at the same time the transistors $Q_4$ and $Q_5$ are turned to OFF. Thus, the word line $W_0$ is connected to a high voltage source of $V_{cc}$, while the word line $W_1$ is connected to the low voltage source, that is, a ground GND. The word line $W_1$ is thereby selected by the CMIS memory decoder while the word line $W_0$ is not. FIG. 1B is an equivalent gate diagram representing the circuit of FIG. 1A.

As apparent from FIGS. 1A and 1B, one CMIS memory decoder is alloted to every two word lines, not to every one word line as in a typical, conventional ROM to RAM. This makes a decoder construction such as that shown in FIG. 1A useful for a highly integrated large-capacity ROM or RAM. In this case, it may be possible to allot one decoder to each line by shifting the relative position between each two adjacent decoder units. However, it should be noted that such an arrangement of decoder units is not always easy to allot to an extremely highly integrated large-capacity memory.

Thus, a construction of one NAND gate per two word lines, as shown in FIGS. 1A and 1B, is useful for the CMIS memory decoder to be used with the relatively highly integrated large-capacity memory.

Figure 2:
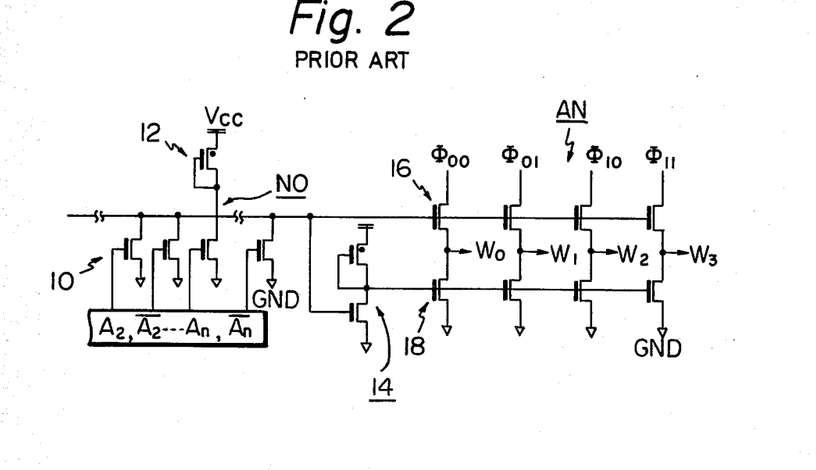
FIG. 2 is a circuit diagram of a second prior art MIS memory decoder being operated under the method for selecting each set of $2^2$ word lines.

FIG. 2 is a circuit diagram of a second prior art MIS memory decoder being operated under a method for selecting each set of $2^2$ word lines. Here, the decoder of this figure is used for a static ROM composed of N-channel MIS devices. The reference symbol NO indicates a NOR gate. The NOR gate NO receives either one of the address signals from each pair of addresses, that is ($A_2$ and $\overline{A_2}$), ..., ($A_n$ and $\overline{A_n}$), via parallel transistors 10. The parallel transistors 10 are connected, on one hand, to the ground GND and, on the other hand, to the source ($V_{cc}$) via a depletion type load transistor 12. Since the decoder of this FIG. 2 is operated under the selection mode defined as being m=2, the address signals, except for the least two significant bits ($A_0$ and $A_1$), are applied to the transistors 10 at their gates. These bits ($A_0$ and $A_1$) specify clock pulses $\phi_{00}$, $\phi_{01}$, $\phi_{10}$, and $\phi_{11}$, which will be mentioned hereinafter. When all the address signals are set to be the logic "L" level, the NOR gate NO produces the output of the logic "H" level. The output from the NOR gate NO is applied to an AND gate AN. To be more specific, the output is, on one hand, applied commonly to gates of parallel transistors 16 and, on the other hand, applied commonly to gates of parallel transistors 18, via an inverter 14. The symbols $\phi_{00}$, $\phi_{01}$, $\phi_{10}$, and $\phi_{11}$ indicate the aforementioned clock pulses, which are specified by the least two significant bits $A_0$ and $A_1$. For example, the clock pulses conform to the following expressions $\phi_{00} = \overline{A_0} \cdot \overline{A_1}$ $\phi_{01} = \overline{A_0} \cdot A_1$ $\phi_{10} = A_0 \cdot \overline{A_1}$ $\phi_{11} = A_0 \cdot A_1$ An example of a circuit for generating the clock pulses $\phi_{00}$ through $\phi_{11}$ will be disclosed hereinafter. The transistors in FIG. 2 are all made of N-channel MIS transistors.

When the NOR gate NO produces the output of the logic "H" level, the transistors 16 are turned to ON, while the transistors 18 are turned to OFF. At this time, if the clock pulse $\phi_{00}$ is specified as being the logic "H" level, the word line $W_0$ is selected. Similarly, if the logic of the clock pulse $\phi_{01}$, $\phi_{10}$, or $\phi_{11}$ is the "H" level, the corresponding word line $W_1$, $W_2$, or $W_3$ is selected. Thus, the CMIS memory decoder of FIG. 2, operated under the method for selecting each set of $2^2$ word lines, is useful for reducing the decoder size, and thereby facilitates the formation of a highly integrated large-capacity memory.

Figure 3:
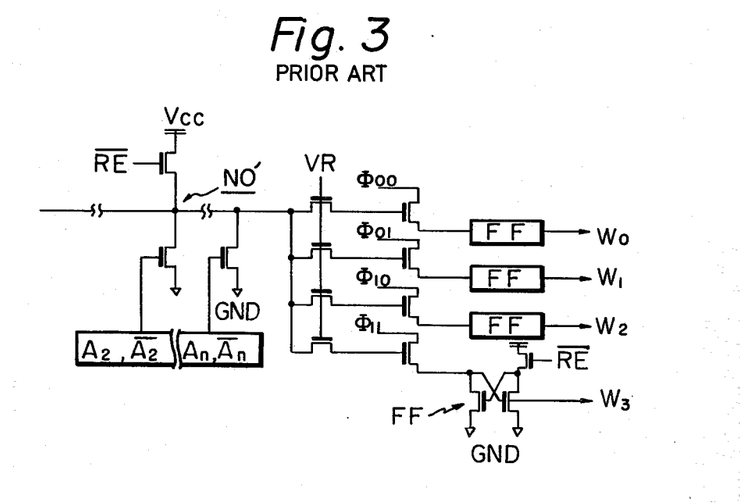
FIG. 3 is a circuit diagram of a third prior art MIS memory decoder being operated under the method for selecting each set of $2^2$ word lines.

FIG. 3 is a circuit diagram of a third prior art MIS memory decoder being operated under the method for selecting each set of $2^2$ word lines. Here, the decoder of this figure is used for a dynamic RAM operated under the method for selecting each set of $2^2$ word lines. As with the decoder of FIG. 2, the "H" level output from the NOR gate NO' is divided into four sets of outputs by the clock pulses $\phi_{00}$, $\phi_{01}$, $\phi_{10}$, and $\phi_{11}$, so as to select respective word lines $W_0$, $W_1$, $W_2$, and $W_3$. The NOR gate NO' includes therein a MIS transistor controlled by a so-called precharge signal $\overline{RE}$. The symbol VR represents a high voltage source ($V_{cc}$) which is internally generated in a corresponding chip. The symbols FF one of the members FF being illustrated in the form of an actual circuit diagram, represent flip flops used to maintain corresponding nonselected word lines at the "L" level.

Figure 4:
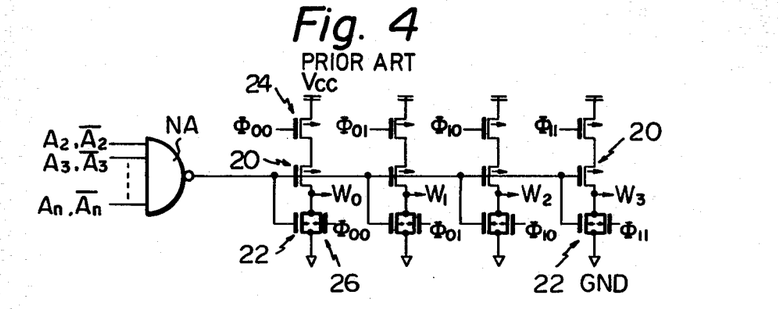
FIG. 4 is a circuit diagram of a fourth prior art CMIS memory decoder being operated under the method for selecting each set of $2^2$ word lines.

FIG. 4 is a circuit diagram of a fourth prior art CMIS memory decoder being operated under the method for selecting each set of $2^2$ word lines. It should be noted that the decoder of FIG. 4 constitutes a CMIS memory decoder, as in the decoder of FIG. 1A, but the decoder of FIG. 1A is operated under the method for selecting each set of $2^1$ word lines ($W_0$ and $W_1$). As is apparent from FIG. 4, the decoder of FIG. 4 is considered to be a combination of the decoders shown in FIGS. 1A and 2. When the NAND gate NA produces the output of the logic "L" level, P-channel MIS transistors 20 are turned to ON, while N-channel MIS transistors 22 are turned to OFF. At this time, if the clock pulse $\phi_{00}$ is supplied, the corresponding P-channel MIS transistor 24 is turned to ON and the corresponding N-channel transistor 26 is turned to OFF, whereby the word line $W_0$ is selected. Similarly any one of the remaining word lines $W_1$, $W_2$, and $W_3$ is selected when the corresponding clock pulse $\phi_{01}$, $\phi_{10}$, or $\phi_{11}$ is supplied. In the decoder of FIG. 4, a problem arises in that a comparable or approximately equal number of P-channel and N-channel MIS transistors exist in one chip, which means that a highly integrated CMIS decoder cannot easily be obtained. This is because, in general, the larger the number of either type of channel MIS transistors as compared to the other, the higher the density of the memory. The reason for this is that the source and drain of each P-channel transistor cannot be connected to the drain and source of a corresponding N-channel transistor by means of an ordinary and simple junction, but requires complicated conductor wiring. THerefore, it may be preferable to remove the transistors 24 from the decoder circuit of FIG. 4.

Figure 5:
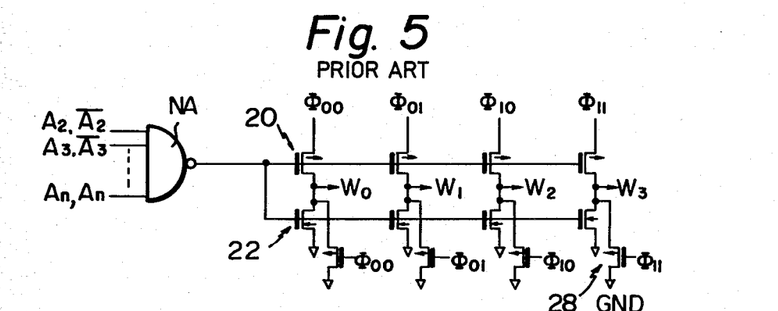
FIG. 5 is a circuit diagram of a fifth prior art CMIS memory decoder being operated under the method for selecting each set of $2^2$ word lines.

FIG. 5 is a circuit diagram of a fifth prior art CMIS memory decoder being operated under the method for selecting each set of $2^2$ word lines. As seen from FIG. 5, the P-channel MIS transistors 24 of FIG. 4 are removed from the decoder of FIG. 5. However, the clock pulses $\phi_{00}$, $\phi_{01}$, $\phi_{01}$, and $\phi_{11}$ are applied directly to respective P-channel MIS transistors 24 at their sources. Thus, the word lines $W_0$ through $W_3$ are energized by the respective clock pulses $\phi_{00}$ through $\phi_{11}$. The undesired transistors, such as transistors 24 of FIG. 4, are thus not needed. However, such an arrangement of the CMIS memory decoder makes it difficult to construct pull-down transistors. The pull-down transistors are used for reducing the voltage level of the word lines toward the ground level GND, when the word lines are changed from a selection state to a nonselection state. That is, the pull-down transistors are discharging transistors. Such pull-down transistors are shown in FIG. 4 as the transistors 26. In this case, since the transistors 26 and the transistors 22 are made of the same type of channel MIS transistors, both transistors 22 and 26 can be formed in and on semiconductor layers having the same conductivity. This can considerably simplify the wiring arrangement. However, in FIG. 5, the transistors 22 and the transistors corresponding to the transistors 26 of FIG. 4 must be formed as different type channel devices. Thus, the transistors corresponding to the transistors 26 of FIG. 4 are formed as P-channel transistors 28 of a different channel type than that of the transistors 22. The transistors 28 receive, at their gate, clock pulses $\phi_{00}$ through $\phi_{11}$. In this case, the transistors 22 and the transistors 28 cannot be formed in and on semiconductor layers having the same conductivity and thereby the transistors 22 must be placed, on the chip, at an area different from the area at which the transistors 28 are placed. This makes the interconnecting lines distributed between the transistors 22 and the transistors 28 relatively complicated.

Figure 6:
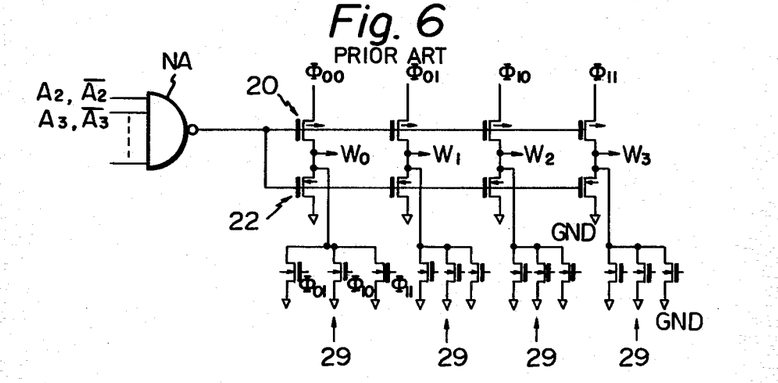
FIG. 6 is a circuit diagram of a sixth prior art CMIS memory decoder being operated under the method for selecting each set of $2^2$ word lines.

FIG. 6 is a circuit diagram of a sixth prior art CMIS memory decoder being operated under the method for selecting each set of $2^2$ word lines. As mentioned above with reference to FIG. 5, it is not preferable to employ the transistors 28 having a different type of channel then the transistors 22. However, in FIG. 6, transistors correspondint to transistors 28 of FIG. 5 are made of N-channel MIS transistors 29 which have the same channel conductivity as transistors 22. A first group of transistors 29, connected to the word line $W_0$ and being specified by the clock pulse $\phi_{00}$, receive clock pulses $\phi_{00}$ through $\phi_{11}$, at their respective gates. Similarly, second, third, and fourth groups of transistors 29, connected to the word lines $W_1$, $W_2$, $W_3$ and being specified by the clock pulses $\phi_{01}$, $\phi_{10}$, $\phi_{11}$, respectively, receive clock pulses ($\phi_{00}$, $\phi_{10}$, $\phi_{11}$), ($\phi_{00}$, $\phi_{01}$, $\phi_{11}$), and ($\phi_{00}$, $\phi_{01}$, $\phi_{10}$), respectively, at their respective gates. Thus, the major portion of the transistors are formed as N-channel MIS transistors. However, it is not advantageous to employ such transistor groups 29. Further, the conductor lines for transferring the clock pulses $\phi_{00}$ through $\phi_{11}$, become very complicated in arrangement.

Figure 7A:
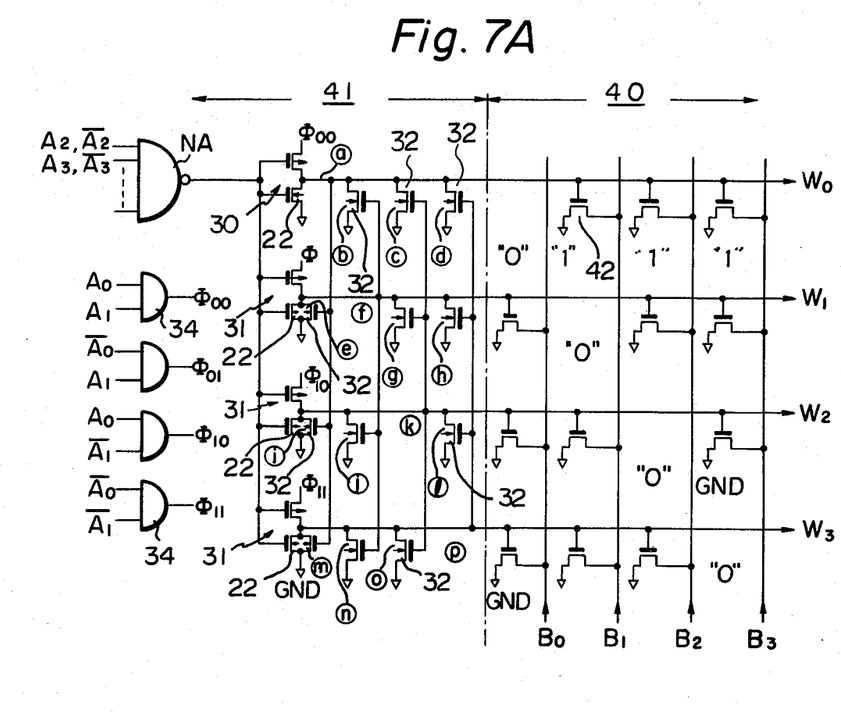
FIG. 7A is a schematic circuit diagram of an embodiment according to the present invention.
Figure 9:
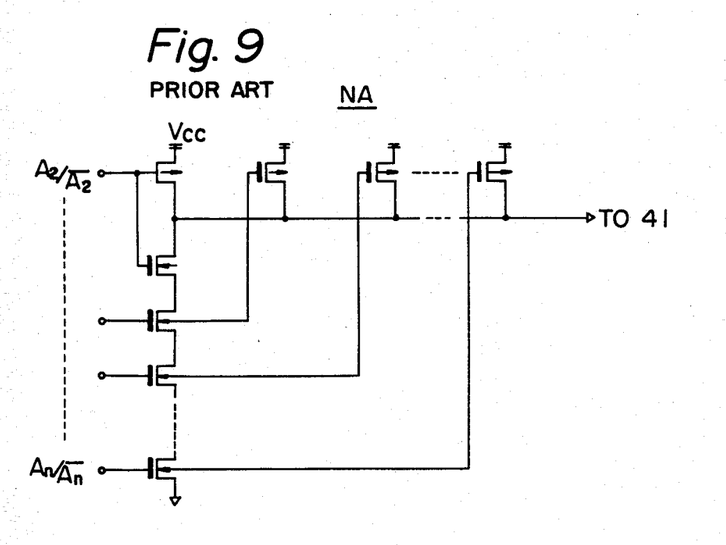
FIG. 9 is a circuit diagram of one example of the NAND gate NA shown in FIG. 7A.

The CMIS memory decoder of the present invention can overcome the various shortcomings mentioned above in reference to FIG. 1A through FIG. 6. FIG. 7A is a schematic circuit diagram of an embodiment according to the present invention. In FIG. 7A, an area 40 represents ROM cell arrays and an area 41 represents a CMIS memory decoder according to the present invention. The ROM cell arrays 40 are illustrated as so-called one-transistor (42) cell type ROM's. The word lines $W_0$, $W_1$, $W_2$, ... form a lattice pattern together with bit lines $B_0$, $B_1$, $B_2$, .... Each stored data of logic "1" is indicated by the presence of a transistor symbol, and each stored data of logic "0" is indicated by the absence of such a transistor symbol. It should be noted that, in the one-transistor-cell type ROM, the distance between each adjacent word line is extremely narrow for example 7.5μ. Therefore, the CMIS memory decoder for accessing the ROM must also be made extremely small. Such requirement for making the word line decoder in the extremely small space, such as 7.5μ, can be satisfied by using the arrangement of the CMIS decoder 41. The output from the NAND gate NA is received by a CMIS inverter 30 and CMIS inverters 31. One example of the NAND gate NA is illustrated in FIG. 9. The N-channel transistors 29 of FIG. 6 are employed again as N-channel transistors 32 acting as the pull-down transistors. A first group of transistors 32, having the drain connected to the word line $W_0$ and being specified by the clock pulse $\phi_{00}$, receive the voltage levels of the remaining three word lines $W_1$, $W_2$, and $W_3$, at respective gates thereof. Similarly, second, third, and fourth groups of transistors 32, having their drain connected to the word lines $W_1$, $W_2$, $W_3$ and being specified by the clock pulses $\phi_{01}$, $\phi_{10}$, $\phi_{11}$, respectively, receive the voltage levels of the respective remaining three word lines ($W_0$, $W_2$, $W_3$), ($W_0$, $W_1$, $W_3$), and ($W_0$, $W_1$, $W_2$), respectively, at the gates thereof.

When the NAND gate NA produces the output of the logic "L" level, the word lines $W_0$ through $W_3$ are specified simultaneously. At this time, any one of the word lines $W_0$ through $W_3$ is selected according to the corresponding clock pulse $\phi_{00}$ through $\phi_{11}$. In this case, the clock pulse having the logic "H" level can select the corresponding word line. Each of the clock pulses $\phi_{00}$ through $\phi_{11}$ is generated from the corresponding one of the four AND gates 34. These four gates receive at their inputs different address signals from each other, as shown at the left side in FIG. 7A.

Figure 8A:
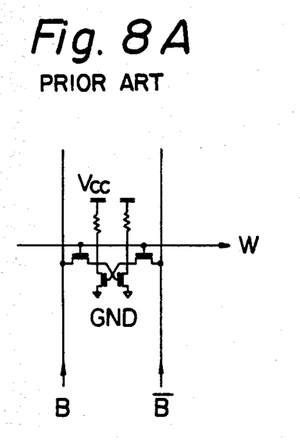
FIG. 8A is a circuit diagram of a first type of memory cell which can be substituted for the memory cell 42 of FIG. 7A.
Figure 8B:
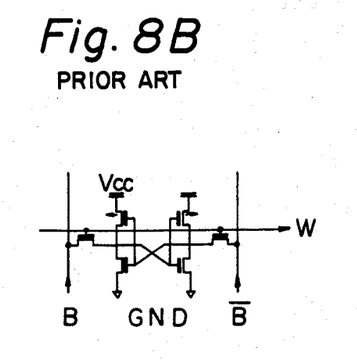
FIG. 8B is a circuit diagram of a second type of memory cell which can be substituted for the memory cell 42 of FIG. 7A.

Although only one set of four word lines $W_0$ through $W_3$ is illustrated in FIG. 7A, other sets of word lines, such as $W_4$ through $W_7$ and $W_8$ through $W_{11}$, may also be introduced in the same chip by using CMIS memory decoders identical to the CMIS memory decoder 41. Further, although ROM cell arrays are illustrated in FIG. 7A, other types of memory, such as a static RAM, can also be applied. For example, memory cells having the circuit construction as shown in FIGS. 8A and 8B may also have the decoder 41 applied thereto. FIG. 8A is a circuit diagram of a first type of memory cell which can be substituted for the memory cell 42 of FIG. 7A. FIG. 8B is a circuit diagram of a second type of memory cell which can be substituted for the memory cell 42 of FIG. 7A. FIG. 9 is a circuit diagram of one example of the NAND gate NA shown in FIG. 7A. In FIG. 9, the symbols $A_2/\overline{A_2}, \ldots, A_n/\overline{A_n}$ are identical with those of FIG. 7A. The output of the NAND gate NA is connected to the CMIS memory decoder 41 of FIG. 7A.

Returning to FIG. 7A, the CMIS memory decoder 41, the pull-down transistors 32, and the transistors 22 for specifying the set of the four word lines $W_0$ through $W_3$ are made of the same type of channel MIS transistors, that is, the N-channel MIS transistors. Therefore, all these N-channel transistors are also formed in the same N-channel memory cell arrays. Further, since the gates of the transistors 32 do not receive the clock pulses $\phi_{00}$ through $\phi_{11}$, as in the decoder of FIG. 6, but receive the voltage levels of the word line themselves, complicated interconnecting lines for transferring the clock pulses to the gates thereof, as in the decoder of FIG. 6, can be omitted, which means high integration of the decoder units can be attained. It should be recognized that such transistors 32 do not create as heavy a load on each word line.

The P-channel transistors in the CMIS memory decoder 41 can increase the voltage levels of the word lines all the way to the level of the source voltage ($V_{cc}$) during a pull-up mode, while they cannot decrease the voltage levels of the word lines all the way to ground level (GND) during a pull-down mode, that is, the voltage levels are limited to a level higher than ground level by the value of the threshold voltage $V_{th}$. Contrary to this, the N-channel transistors in the CMIS memory decoder 41 can decrease the voltage levels of the word lines all the way to the ground level (GND) during a pull-down mode, while they cannot increase the voltage levels of the word lines all the way to the source voltage ($V_{cc}$) during a pull-up mode, that is, the voltage levels are limited to a level lower than the source voltage ($V_{cc}$) level by the value of the threshold voltage $V_{th}$. Accordingly, the CMIS memory decoder of FIG. 7A produces an advantage in that the selected word line can be driven between the full $V_{cc}$ level and the full ground (GND) level.

Figure 7B:
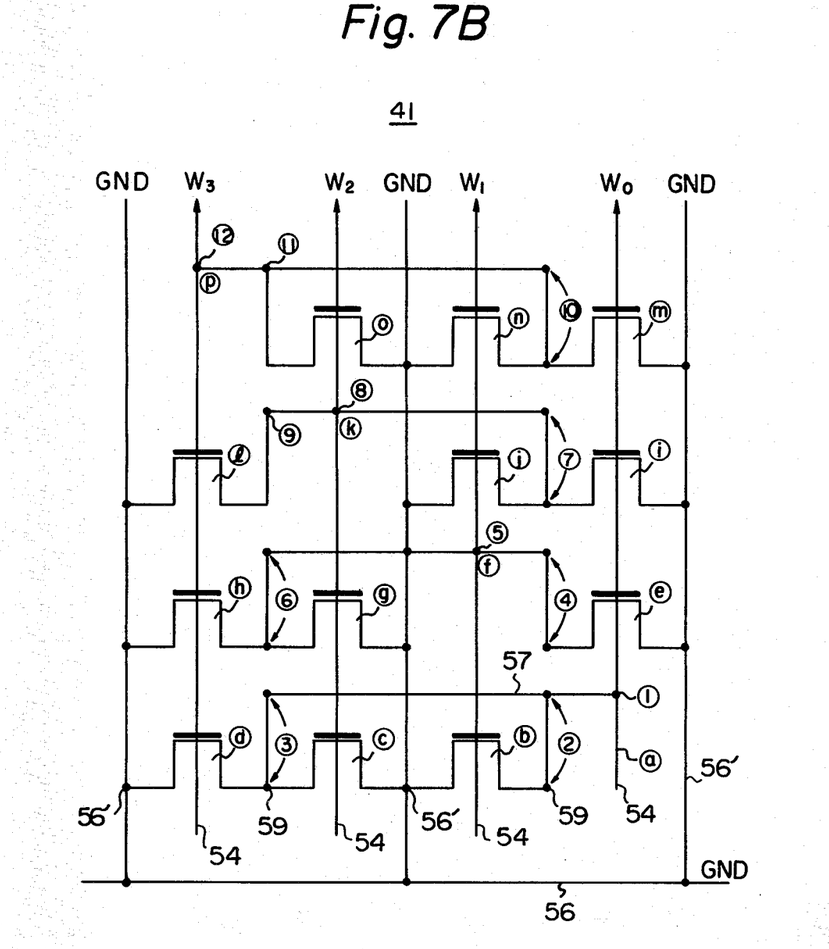
FIG. 7B is an actual circuit diagram of the embodiment according to the present invention.
Figure 7C:
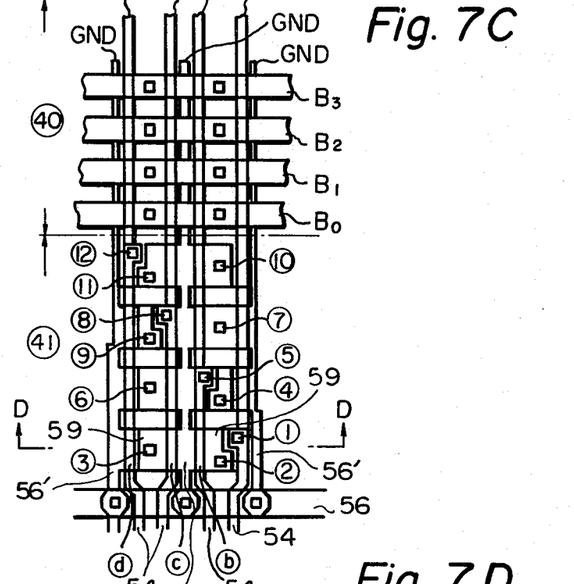
FIG. 7C is a plan view of the CMIS memory decoder defined by the circuit diagram shown in FIG. 7B.

FIG. 7B is an actual circuit diagram of the embodiment according to the present invention. It should be understood that FIG. 7A illustrates a schematic circuit diagram of the same. In order to facilitate understanding of the present invention, the arrangement of the CMIS memory decoder 41 is rotated 90° with respect to that of FIG. 7A. The symbols $W_0$ through $W_3$ and GND have already been explained. The portions or members represented by the reference symbols ⓐ, ⓑ, ⓒ, . . . , ⓟ are identical to those shown in FIG. 7A, while the reference numerals ①, ②, ③, . . . , ⑫, represent contact windows shown with the same reference numerals in FIG. 7C. FIG. 7C is a plan view of the CMIS memory decoder defined by the circuit diagram shown in FIG. 7B. In FIG. 7C, an area containing the CMIS memory decoder according to the present invention is indicated by the reference numeral ㊶ (reference numeral 41 in FIG. 7A) and an area containing the conventional ROM cell arrays is indicated by the reference numeral ㊵ (reference numeral 40 in FIG. 7A). The symbols $W_0$ through $W_3$, GND, and $B_0$ through $B_3$ have already been explained.

Figure 7D:
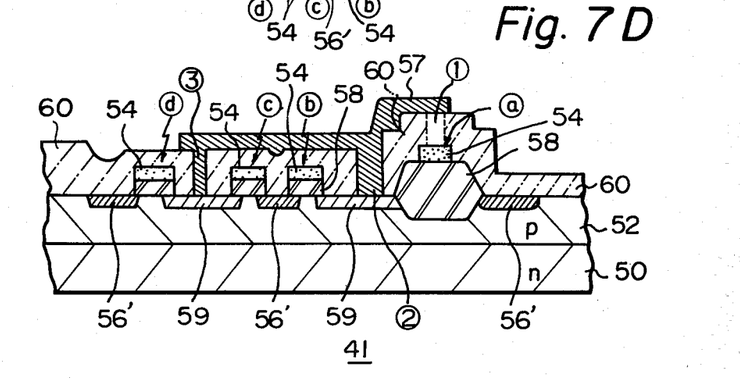
FIG. 7D is a cross-sectional view taken along the line D—D shown in FIG. 7C.

FIG. 7D is a cross-sectional view taken along the line D—D shown in FIG. 7C. In FIG. 7D, the reference numeral 50 represents an N⁻-type semiconductor layer on which a P-well 52 is formed. In the P-well 52, the transistors b, c, and d (transistor 32 in FIG. 7A) are formed (refer to the portions represented by identical reference symbols in FIGS. 7A, 7B, and 7C). The reference symbols 54 represent gates of the transistors 32 (ⓑ, ⓒ, ⓓ), which are extended to the word lines $W_0$, $W_1$, $W_2$, $W_3$ respectively and are made of polycrystalline silicon. The portion a is identical to the portion shown in FIGS. 7A and 7B. The reference number 56 represents ground (GND) lines made of aluminum, and is connected to the ground diffusion region 56' (N-type) formed in the P-well 52. The reference symbols 59 represent the diffusion region (N-type) which are drains of each transistors ⓑ, ⓒ, ⓓ. The conductor line 57 connects the drains 59 to the word line $W_0$ (ⓐ) via holes ①, ②, ③ which are formed in the PSG (phosphorus silicate glass) 60. Other insulating layers are represented by reference numbers 58.

It is very important that the CMIS memory decoder 41, for selecting the set of four word lines $W_0$ through $W_3$, just fits inside the width between the word lines $W_0$ and $W_3$, as is apparent from the arrangement shown in FIG. 7C.

We claim:

1. A CMIS memory decoder for selecting each set of $2^m$ (where m is a positive integer) word lines operatively connected to a memory array operatively connected to bit lines, said decoder having connected thereto an input gate having an output and receiving address signals having a first m bit portion and a second bit portion, the second bit portion being used for simultaneously specifying the $2^m$ word lines and the first bit portion for generating clock pulses, said decoder comprising:
   CMIS inverters, operatively connected to the output of the input gate, and each inverter being driven by the corresponding clock pulse generated in dependence upon the first m bit portion of said address signal, an output of each of the inverters being operatively connected to the corresponding one of the $2^m$ word lines; and
   $2^m - 1$ pull-down transistors for each of the $2^m$ word lines and operatively connected to the respective word line and each having a gate operatively connected to one of the remaining $2^m - 1$ word lines.

2. A CMIS memory decoder as set forth in claim 1, wherein said $2^{m-1}$ pull-down transistors are N-channel MIS transistors, and are connected between each word line and ground.

3. A CMIS memory decoder as set forth in claim 2, wherein each of said CMIS inverters comprises a pair of transistors connected in series both having gates, both gates being commonly connected to the output of said input gate, one said pair of transistors receiving one of the clock pulses and being a P-channel MIS transistor, and the other of said pair of transistors being an N-channel MIS transistor connected to ground.

4. A CMIS memory decoder as set forth in claim 3, wherein said CMIS inverters and said pull-down transistors are formed inside the width between one end of the group of the $2^m$ word lines and the other end thereof.

5. A memory decoder, operatively connectable to receive address signals, for a memory cell array having word lines, comprising:
   control means, operatively connectable to receive the address signals, for generating control signals for selecting the word lines in dependence upon the address signals;
   pull-up means, operatively connected to said control means and the word lines, for pulling the selected word lines to a first voltage in dependence upon the control signals; and
   pull-down means, operatively connected to the word lines, for pulling non-selected word lines to a second voltage in dependence on the first voltage.

6. A memory decoder as set forth in claim 5, wherein the number of word lines is equal to n where n is an integer greater than or equal to 2, and wherein said pull-down means comprises n pull-down transistor sets, each set operatively connected to a respective word line and each set comprising n−1 pull-down transistors operatively connected to the respective word line, each of the n−1 pull-down transistors operatively connected to the same word line being controlled by a different one of the remaining n−1 word lines.

7. A memory decoder as set forth in claim 6, wherein said pull-up means comprises n inverters operatively connected to said control means and said n word lines respectively.

8. A memory decoder as set forth in claim 7, wherein each of said n inverters comprises:
a first transistor operatively connected to said control means and the respective word line; and
a second transistor operatively connected to said control means and the respective word line.

9. A memory decoder as set forth in claim 8, wherein said control means comprises:
a NAND circuit operatively connected to said first and second transistors of each of said n inverters and to receive a part of said address signals; and
n AND circuits each operatively connected to a respective one of said first transistors of said n inverters and to receive the remainder of said address signals.

10. A memory decoder as set forth in claim 9, wherein said first transistor is a p-channel transistor.

11. A memory decoder as set forth in claim 10, wherein said n−1 pull-down transistors and said second transistor are n-channel devices.

12. A memory decoder as set forth in claim 11, wherein n equals two.

13. A memory decoder as set forth in claim 11, wherein n equals four.

14. A memory decoder as set forth in claim 13, wherein said three pull-down transistors operatively connected to one of the four word lines are operatively connected to the second voltage.

15. A memory decoder as set forth in claim 14, wherein each of said four AND circuits generate the first voltage.

16. A memory decoder as set forth in claim 15, wherein said four word lines define an area width on a semiconductor substrate, and wherein said first and second transistors and said twelve pull-down transistors are formed within said area width.

* * * * *

UNITED STATES PATENT AND TRADEMARK OFFICE
CERTIFICATE OF CORRECTION

PATENT NO. : 4,455,629
DATED : JUNE 19, 1984
INVENTOR(S) : YASUO SUZUKI ET AL.

It is certified that error appears in the above-identified patent and that said Letters Patent is hereby corrected as shown below:

Col. 4, line 68, "THerefore" should be --Therefore--.

Col. 5, line 47, "spondint" should be --sponding--.

Col. 7, line 56, "b, c, and d" should be --ⓑ, ⓒ, and ⓓ--.

Claim 2, line 2, "$2^{m-1}$" should be --$2^m-1$--.

Signed and Sealed this

Sixteenth Day of July 1985

[SEAL]

Attest:

DONALD J. QUIGG

Attesting Officer

Acting Commissioner of Patents and Trademarks